(12) United States Patent
Rieken

(10) Patent No.: US 10,090,706 B2
(45) Date of Patent: Oct. 2, 2018

(54) VLF BAND SENSOR ARRAY FOR POWER DISTRIBUTION NETWORKS

(71) Applicant: Aclara Technologies LLC, Hazelwood, MO (US)

(72) Inventor: David W. Rieken, St. Peters, MO (US)

(73) Assignee: Aclara Technologies LLC, St. Louis, MO (US)

( * ) Notice: Subject to any disclaimer, the term of this patent is extended or adjusted under 35 U.S.C. 154(b) by 414 days.

(21) Appl. No.: 14/867,978

(22) Filed: Sep. 28, 2015

(65) Prior Publication Data

US 2016/0091881 A1   Mar. 31, 2016

Related U.S. Application Data

(60) Provisional application No. 62/057,300, filed on Sep. 30, 2014.

(51) Int. Cl.
*G05B 19/048* (2006.01)
*H02J 13/00* (2006.01)
*G01R 19/25* (2006.01)

(52) U.S. Cl.
CPC ........ *H02J 13/002* (2013.01); *G01R 19/2513* (2013.01); *Y02E 60/7815* (2013.01); *Y04S 40/121* (2013.01)

(58) Field of Classification Search
CPC .................................................. G05B 19/048
See application file for complete search history.

(56) References Cited

U.S. PATENT DOCUMENTS

| | | | |
|---|---|---|---|
| 2010/0220774 A1* | 9/2010 | Park | H04B 1/71635 375/222 |
| 2012/0147938 A1* | 6/2012 | Schwager | H04B 3/54 375/222 |
| 2014/0120962 A1* | 5/2014 | Merlin | H04W 68/02 455/466 |

* cited by examiner

*Primary Examiner* — Tri Hoang
(74) *Attorney, Agent, or Firm* — Senniger Powers LLP

(57) ABSTRACT

An apparatus, network system, and method for detecting network phenomena of a power distribution network. A signal injection device adapted to be connected to the power distribution network injects a signal having signal parameters onto the power distribution network. A signal receiving device adapted to be connected to the power distribution network receives the injected signal on the power distribution network. The signal receiving device is adapted to determine the signal parameters of the received signal and is adapted to evaluate the signal parameters of the injected signal with respect to the determined signal parameters of the received signal. An output device connected to the signal receiving device provides an indication of the determined evaluation.

20 Claims, 3 Drawing Sheets

VLF BAND SENSOR ARRAY FOR POWER DISTRIBUTION NETWORKS

BACKGROUND

The present invention generally relates to sensor arrays for networks and, in particular, a VLF band active sensor array for power distribution networks for sensing network properties.

Power distribution networks are frequently monitored by individual passive sensors or arrays of passive sensors. Passive sensors are generally limited to detecting such parameters as voltage and current phasors, harmonics, transients, and noise.

SUMMARY

In one form, an apparatus detects network phenomena of a power distribution network. A signal injection device adapted to be connected to the power distribution network injects a signal having signal parameters onto the power distribution network. A signal receiving device adapted to be connected to the power distribution network receives the injected signal on the power distribution network. The signal receiving device is adapted to determine the signal parameters of the received signal and is adapted to evaluate the signal parameters of the injected signal with respect to the determined signal parameters of the received signal. An output device connected to the signal receiving device provides an indication of the determined evaluation.

Other forms include a network system and a method.

Other objects and features will be in part apparent and in part pointed out hereinafter.

BRIEF DESCRIPTION OF THE DRAWINGS AND APPENDIX

Figure 1:
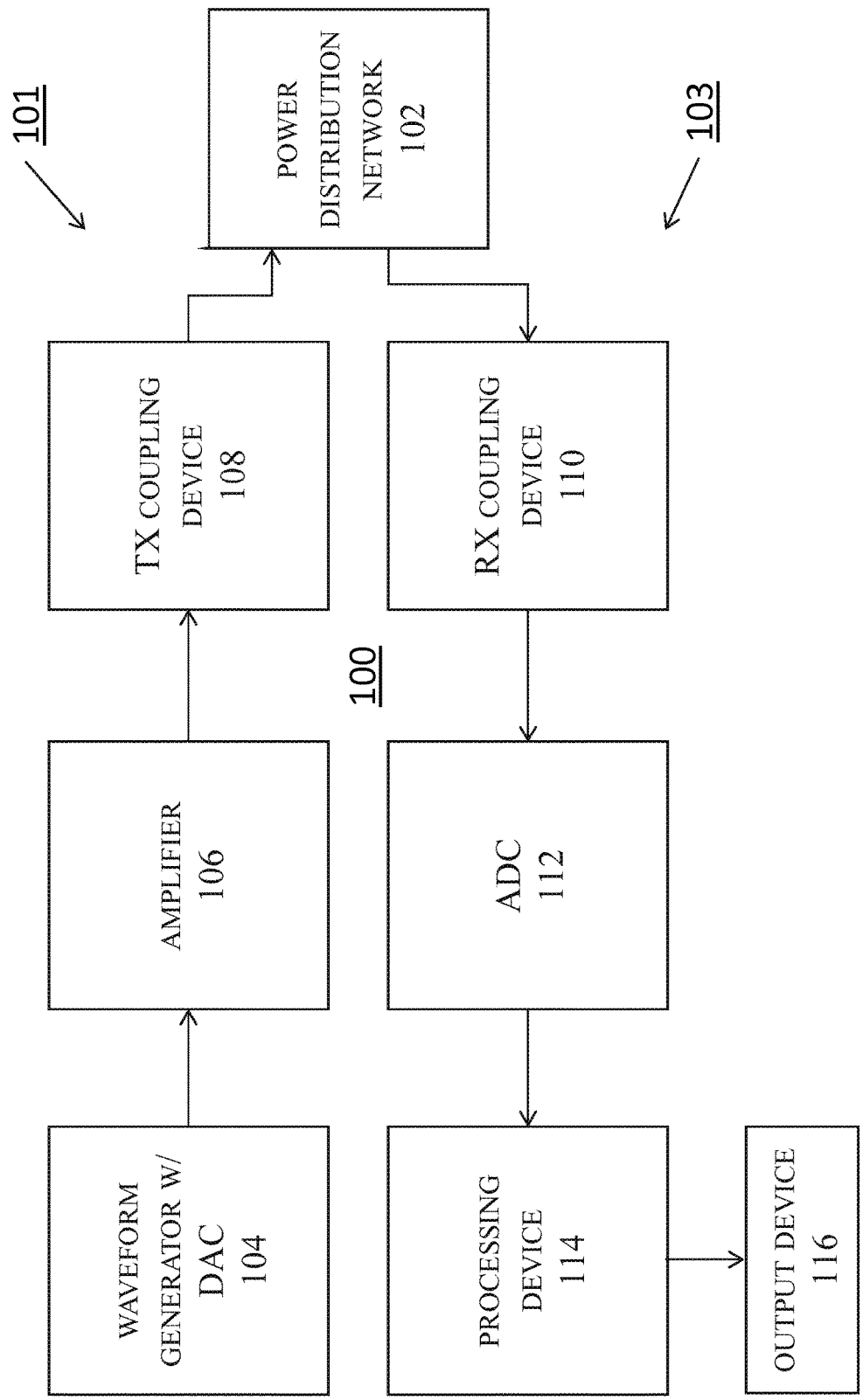
FIG. 1 is a block diagram of one embodiment of a sounding device according to the invention for connecting to a power distribution network for sensing network properties of the power distribution network.

APPENDIX A illustrates the parameters for a two-port network sounding and for a three-port network sounding.

Corresponding reference characters indicate corresponding parts throughout the drawings.

DETAILED DESCRIPTION

When developing a VLF-band power line communication system, changes in the communication channels frequently occur over time. These changes result in nuisance parameters estimated by an equalizer of a receiver as a necessary prerequisite to demodulating a message transmitted between communication channels. However, the parameters themselves can provide valuable information about the electrical properties of the channel, which in this case is the power distribution network itself. Thus, the parameters themselves provide valuable information about changes in the power distribution network.

Figure 2:
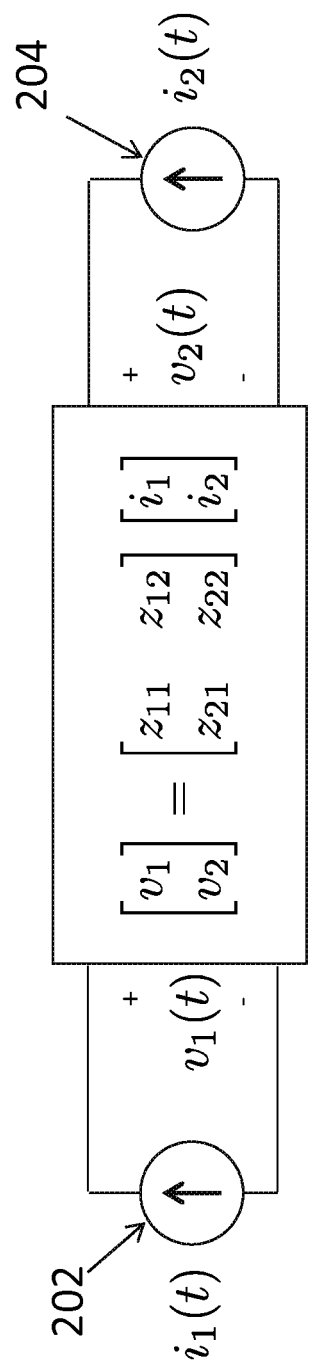
FIG. 2 illustrates an equivalent circuit diagram for a two-port network sounding in which two sounding devices as shown in FIG. 1 are connected to a power distribution network.
Figure 3:
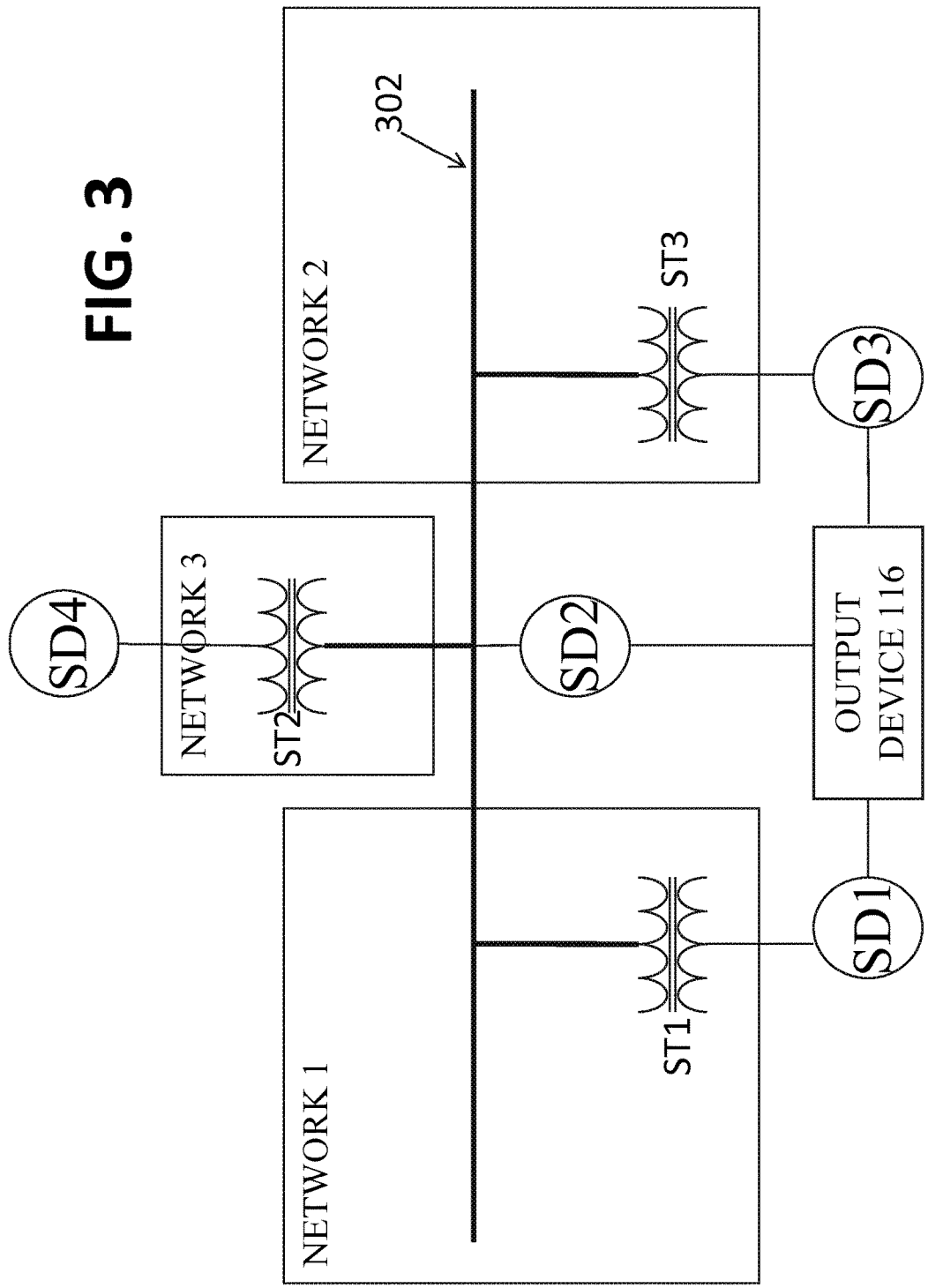
FIG. 3 illustrates a schematic diagram of a medium voltage feeder having three service transformers connected to it and having four sounding devices connected to it.

By injecting VLF band signals into a power distribution network and measuring the response at targeted sites throughout the network, certain network properties that are either unobservable or imprecisely estimated with passive arrays are able to be directly observed. These network properties include, but are not limited to, impedance, network gains, and other electrical properties. For example, the estimated properties are the two-port network parameters illustrated in FIG. 2 by variables $z_{11}$, $z_{12}$, $z_{21}$, $z_{22}$. These may be functions of time and frequency. Further, injected signals facilitate decomposition of the network into sub-networks so that the sub-networks can be mathematically isolated and interrogated. An example of the decomposition is shown in FIG. 3 where a four-port network is decomposed into a network of three two-port networks.

As a result, network phenomena for the network and its sub-networks can be detected and localized, including, but not limited to, faults, transformer failures, reactive load changes, etc. The phenomena that can be observed include any parameters that are observable through the two-port network parameters as illustrated in FIG. 2. In addition to the listed parameters, other examples include transformer winding ratios, transformer loading, continuity, and capacitor bank switching.

FIG. 1 is a block diagram of one embodiment of a sounding device 100 according to the invention for connecting to a power distribution network 102 for sensing network properties of the power distribution network 102. The device 100 comprises a signal injection device 101 adapted to be connected to the power distribution network 102 for injecting a signal having signal parameters onto the power distribution network 102. The device 100 also comprises signal receiving device 103 adapted to be connected to the power distribution network 102 for receiving injected signal on the power distribution network. The signal receiving device 103 is adapted to determine the signal parameters of the received signal and adapted to evaluate the signal parameters of the injected signal with respect to the determined signal parameters of the received signal. As a result, the signal receiving device 103 is adapted to determine a network phenomenon corresponding to the evaluated parameters. It is contemplated that one or more components of the signal injection device 101 may be shared with the signal receiving device 103.

In one form, the signal injection device 101 comprises an arbitrarily programmable, band-limited waveform generator 104, an amplifier 106, and a transmitting (TX) coupling device 108. The arbitrarily programmable, band-limited waveform generator 104 (e.g. a microprocessor connected to a digital-to-analog converter (DAC)) provides at its output analog sounding signals to an input of an amplifier 106. The output analog sounding signals are amplified by the amplifier 106 having an output port electrically connected to a line of the power distribution network 102 via a transmitting (TX) coupling device 108. The amplifier 106 has an output port providing an amplified sounding signal for injection onto the power distribution network 102. The coupling device 108 can be any device or circuit which electrically injects output signals of the amplifier 106 onto the power distribution network 102 so that the amplified sounding signals are transmitted over the power distribution network 102. For example, the coupling device 108 can be capacitive coupler, capacitive and inductive coupler, or an H-bridge coupler. The power distribution network can be a low-voltage (LV) network, or a medium-voltage (MV) network, or even a high-voltage (HV) network. Depending on the network voltage, the coupling device 108 must be equipped to deal with the voltage of the network to which it connects.

In one form, the signal receiving device 103 comprises a receiving (RX) coupling device 110, an analog-to-digital converter (ADC) 112, and processing device 114. Injected, analog, amplified sounding signals are received by the receiving (RX) coupling device 110 having an input port electrically connected to the line of the power distribution network 102. The coupling device 110 provides samples of the voltage and or the current from the power distribution network 102 to the processing device 114 via the ADC 112. In particular, the received sounding signals are converted to receive digital signals by the ADC 112. The converted, received digital signals are provided at an output port of the ADC 112 to an input port of the processing device 114 (e.g. a microprocessor). The processing device 114 is pre-programmed with the signal parameters of the analog sounding signals provided by the waveform generator 104. The signal parameters include but are not limited to impedance and network gain. The four variables in FIG. 2 are the signal parameters that are estimated. From those estimates, parameters of direct interest such as winding ratios, impedance changes due to faults, and load changes can be inferred.

The processing device 114 determines the signal parameters of the converted, received digital signals. The processing device 114 evaluates (e.g., estimates, compares) the injected signal parameters with respect to the received signal parameters. The evaluation of the parameters is indicative of network phenomenon. In one form, the channel parameters are estimated from the received signal using knowledge of the transmitted signal. The parameters and their variation over time infer changes in the power distribution network 102. For example, in one form a projection operation uses an OFDM demodulation and CDMA despreading of the received signal to determine the differences in the injected signal parameters and the received signal parameters. CDMA ensures that transmitted signals from different transmitters are orthogonal to one another. This makes it possible to infer parameters describing the channel from any node with a transmitter to any node with a receiver. These are also the elements of the N×N impedance matrix associated with the N-port network under interrogation. OFDM ensures that within the transmitted signal, there are orthogonal frequency components. This makes it easy to infer the channel parameters as a function of frequency. The subband gains (and other channel parameters) are estimated as part of the equalization process and can be used to infer the network parameters.

The processing device 114 can be adapted to determine a network phenomenon corresponding to the evaluated parameters. Furthermore, by evaluating sub-network parameters, a determination can be made as to the type of change to the network and the location of the change. For example, an increase in the channel gain of the signal parameters may be an indication of an increased load on a sub-network of the power distribution network 102. As another example, a zero gain and/or very high (e.g., infinite) impedance may be an indication of an open circuit. The provided examples are examples only and are not an exhaustive set of possible phenomena. Any network phenomenon that results in a change in the two-port network parameters as shown in FIG. 2 is observable from the network parameters. For example, the transformer winding ratio is directly observable from the network parameters. The presence of switched-load power supplies is also inferable.

It is contemplated that one or more components of the signal injection device 101 may be shared with the signal receiving device 103. For example, a single microprocessor can be used as part of the waveform generator 104 and the processing device 114. As another example, the same coupling device can connect the power distribution network to the DAC of the waveform generator 104 and to the ADC 112.

In view of the above, the systems, apparatus, devices, and method noted herein provide for precision network monitoring on a scale not possible with passive sensors. For example, by employing VLF-band transmitters and receivers throughout a network, faults, transformer failures, transformer overloading, reactive load changes, as well as other network phenomena can be detected.

In one form, the processing device 114 is connected to an output device 116 for providing an indication of the determined evaluation network phenomenon. For example, the inferences can be reported to some other software and/or system which provide a user interface. Alternatively or in addition, the inferences can also be provided to a database, and/or as input to another inference algorithm. As a specific example, the output device 116 may include a flat panel display which presents to a technician one or more of the injected signal parameters, the received signal parameters, text or graphical information regarding the evaluation the signal parameters of the injected signal with respect to the determined signal parameters of the received signal, and text or graphical information regarding the determined network phenomenon corresponding to the evaluated parameters. The graphical information can be a waveform diagram of the injected signal and/or the received signal.

FIG. 2 illustrates a model 200 of a point-to-point VLF-band power line communication channel. FIG. 2 illustrates an equivalent circuit diagram for a two-port network sounding in which two sounding devices 100 as shown in FIG. 1 are connected to the power distribution network 102 at two different points. These points may be separated by any length of LV, MV, or HV transmission line, a number of service transformers, and multiple loads. The entire circuit excluding the two connection points is the unknown network and it is the properties of this network that system 100 estimates. The signal injection devices 101 can be modeled as either a current source or voltage source, depending on how the amplifier functions.

Without loss of generality, FIG. 2 demonstrates operation assuming a current source transmitter. In particular, signal injection devices 101 are represented by current sources 202, 204 transmitting signals $i_1(t)$ and $i_2(t)$. For computational simplicity, these signals are considered orthogonal, although they need not be. Both transmitting current sources 202, 204 transmit their respective signals simultaneously and sample the voltage at their injection points, $vi_1(t)$ and $v_2(t)$:

$$\int_0^T i_1(t)i_2(t)dt=0$$

$$v_{nm}=\int_0^T v_n(t)i_m(t)dt$$

By projection of the sampled voltage onto each of the transmitted currents, two vectors can be constructed. These vectors span the null space of a matrix parameterized by the two-port network parameters, $z_{\{11\}}$, $z_{\{12\}}$, $z_{\{21\}}$, $z_{\{22\}}$, and can be used to infer those parameters:

$$\begin{bmatrix} -1 & 0 & z_{11} & z_{12} \\ 0 & -1 & z_{21} & z_{22} \end{bmatrix} \begin{bmatrix} v_{11} & v_{12} \\ v_{21} & v_{22} \\ i_{11} & 0 \\ 0 & i_{22} \end{bmatrix} = 0$$

Each processing device is programmed as noted above to determine a solution to the network parameters. The solution for the above yields the four (4) equations shown below. This procedure is outlined in section 1 of Appendix A for a two-port network sounding.

$$\hat{z}_{11} = \frac{v_{11}}{i_{11}}$$
$$\hat{z}_{12} = \frac{v_{12}}{i_{22}}$$
$$\hat{z}_{21} = \frac{v_{21}}{i_{11}}$$
$$\hat{z}_{22} = \frac{v_{22}}{i_{22}}$$

During signal injection periods of time, each device 202, 204 records the current and voltage at each of the transmit points of the other device 204, 202, respectively, as well as its own injected signal. By computing the inner product of the two received signals with the transmitted signals, scalars are computed. These scalars, in turn, can be used to compute the two-port network parameters of the unknown network. Over time, changes in these parameters are indicative of a network phenomenon, as noted herein.

FIG. 3 illustrates a schematic diagram of a medium voltage (MV) feeder 302 having three service transformers ST1, ST2, ST3 connected to feeder 302 and having three sounding devices SD1, SD2, SD3 connected to feeder 302. FIG. 3 illustrates a three-port network. This network can be modeled as a network of two-port networks as shown. As in the two-port network, orthogonal (or linearly independent) current signals are transmitted at each of the endpoints and the responses recorded. Using a procedure similar to the procedure described above regarding FIG. 2, the network parameters for each of networks 1, 2, and 3 can be determined from this data.

This determination process for processing device 114 for a three-port network sounding is outlined in section 2 of Appendix A. In particular, section 2 of the Appendix A shows how the measured voltages at each of the transmit points can be used to solve for the parameters of the component two-port network parameters. The aggregate of all signals must satisfy the relationship shown in equation (13), and in row-reduced form in equation (17). In particular, this 12-dimensional vector lies within the null space of that matrix, which is a three dimensional subspace with basis vectors shown in (18). Given an appropriate subset of the 12-dimensional signal vectors, the null-space can be inferred and the basis vectors determined. This, in turn, leads to a solution of the individual network parameters which can be monitored over time to determine changes indicative of network phenomena.

The configurations illustrated in FIG. 3 can be expanded and generalized for networks with more endpoints by applying the same mathematical analysis outlined above regarding Appendix A. In practice, it should be understood that a network may have a much more complicated graph than that shown in FIG. 3. In addition, the configurations can be generalized for transmissions that are linearly independent, but not orthogonal.

It is also contemplated that procedure as outlined above regarding section 2 of Appendix A for a three-port network sounding can be expanded and individually defined for each network. For example, a test site can be identified for a particular network and a prototype sensor array deployed for testing. Preferably, the test site would be set up such that various network conditions can be tested (e.g. faults, transformer overloading, etc.).

Thus, FIG. 3 illustrates a network system for use with a power distribution network according to one embodiment of the invention. A plurality of sounding devices SD1, SD2, SD3, SD4 detect network phenomena of the power distribution networks 1, 2, 3. Each sounding device SD1, SD2, SD3, SD4 comprises a signal injection device 101 and/or a signal receiving device 103. Not all sounding devices need to include a signal injection device 101. For example, sounding device SD2 need not inject current and can be a simple voltage measuring device. Each signal receiving device is adapted to determine the signal parameters of each of the received signals. Each signal receiving device evaluates the signal parameters of each of the injected signals with respect to the determined signal parameters of its corresponding received signal.

For example, the signal receiving device of SD1 is pre-programmed with the signal parameters of the injected signals from the signal injection devices of SD1, SD2, and SD3. The signal receiving device of SD1 determines the signal parameters of the received signal corresponding to the injected signal from the signal injection devices of SD1, SD2, and SD3. The signal receiving device of SD2 and SD3 are similarly programmed to determine the received signal corresponding to the injected signal.

As shown in FIG. 3, at least one output device 116 is connected to the signal receiving devices of the plurality of sounding devices SD1, SD2, SD3 for providing an indication of the determined evaluations.

In one form, the invention includes a method for detecting network phenomena of a power distribution network, comprising:

injecting signals onto the power distribution network 102 by signal injecting devices 101, each signal having signal parameters;

receiving the injected signals on the power distribution network 102 by the signal receiving devices 103;

determining by the signal receiving devices 103 the signal parameters of the received signals;

evaluating (e.g., estimates, comparing) by the signal receiving devices 103 the signal parameters of each of the injected signals with respect to the determined signal parameters of its corresponding received signal; and providing by output device 116 an indication of the determined evaluation.

The Abstract and summary are provided to help the reader quickly ascertain the nature of the technical disclosure. They are submitted with the understanding that they will not be used to interpret or limit the scope or meaning of the claims. The summary is provided to introduce a selection of concepts in simplified form that are further described in the Detailed Description. The summary is not intended to identify key features or essential features of the claimed subject matter, nor is it intended to be used as an aid in determining the claimed subject matter.

For purposes of illustration, programs and other executable program components, such as the operating system, are illustrated herein as discrete blocks. It is recognized, however, that such programs and components reside at various times in different storage components of a computing device, and are executed by a data processor(s) of the device.

Although described in connection with an exemplary computing system environment, embodiments of the aspects of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well-known computing systems, environments, and/or configurations that may be suitable for use with aspects of the invention include, but are not limited to, personal computers, server computers, handheld or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the aspects of the invention may be described in the general context of data and/or processor-executable instructions, such as program modules, stored one or more tangible, non-transitory storage media and executed by one or more processors or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote storage media including memory storage devices.

In operation, processors, computers and/or servers may execute the processor-executable instructions (e.g., software, firmware, and/or hardware) such as those illustrated herein to implement aspects of the invention.

Embodiments of the aspects of the invention may be implemented with processor-executable instructions. The processor-executable instructions may be organized into one or more processor-executable components or modules on a tangible processor readable storage medium. Aspects of the invention may be implemented with any number and organization of such components or modules. For example, aspects of the invention are not limited to the specific processor-executable instructions or the specific components or modules illustrated in the figures and described herein. Other embodiments of the aspects of the invention may include different processor-executable instructions or components having more or less functionality than illustrated and described herein.

The order of execution or performance of the operations in embodiments of the aspects of the invention illustrated and described herein is not essential, unless otherwise specified. That is, the operations may be performed in any order, unless otherwise specified, and embodiments of the aspects of the invention may include additional or fewer operations than those disclosed herein. For example, it is contemplated that executing or performing a particular operation before, contemporaneously with, or after another operation is within the scope of aspects of the invention.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the aspects of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

The above description illustrates the aspects of the invention by way of example and not by way of limitation. This description enables one skilled in the art to make and use the aspects of the invention, and describes several embodiments, adaptations, variations, alternatives and uses of the aspects of the invention, including what is presently believed to be the best mode of carrying out the aspects of the invention. Additionally, it is to be understood that the aspects of the invention is not limited in its application to the details of construction and the arrangement of components set forth in the following description or illustrated in the drawings. The aspects of the invention are capable of other embodiments and of being practiced or carried out in various ways. Also, it will be understood that the phraseology and terminology used herein is for the purpose of description and should not be regarded as limiting.

Having described aspects of the invention in detail, it will be apparent that modifications and variations are possible without departing from the scope of aspects of the invention as defined in the appended claims. It is contemplated that various changes could be made in the above constructions, products, and methods without departing from the scope of aspects of the invention. In the preceding specification, various preferred embodiments have been described with reference to the accompanying drawings. It will, however, be evident that various modifications and changes may be made thereto, and additional embodiments may be implemented, without departing from the broader scope of the aspects of the invention as set forth in the claims that follow. The specification and drawings are accordingly to be regarded in an illustrative rather than restrictive sense.

What is claimed is:

1. An apparatus for detecting network phenomena fault of a power distribution network having a transformer, comprising:
   a signal injection device adapted to be connected to the power distribution network for injecting a VLF band analog sounding signal having signal parameters onto the power distribution network wherein the signal parameters of the sounding signal comprise at least one of a variable voltage, a variable current, and a variable gain and wherein the signal injection device comprises:
   a programmable waveform generator comprising a microprocessor connected to a digital-to-analog converter having an output port adapted to provide the analog sounding signal having the signal parameters;
   a transmitting coupler electrically connected to a line of the power distribution network; and
   an amplifier having an input port connected to the output of the generator for receiving the analog sounding signal and having an output port electrically connected to the line of the power distribution network via the transmitting coupler providing an amplified sounding signal injected on to the power distribution network;

a signal receiving device adapted to be connected to the power distribution network for receiving the injected signal on the power distribution network, said signal receiving device adapted to identify the signal parameters of the received signal and adapted to compare the signal parameters of the injected signal with respect to the identified signal parameters of the received signal wherein the signal receiving device comprises:
a receiving coupler electrically connected to the line of the power distribution network for providing received sounding signals;
an analog-to-digital converter having an input port electrically connected to the line of the power distribution network via the receiving coupler and having an output port for providing converted, received digital signals;
a digital processor having an input port connected to the output port of the analog-to-digital converter for receiving the converted, received digital signals, wherein the digital processor compares the injected signal parameters with the received signal parameters to determine impedance or network gain indicative of a network fault corresponding to the compared parameters wherein the network fault comprise at least one of a power distribution network fault and a transformer fault; and
a display connected to the microprocessor adapted to provide an indication of one or more of the determined network faults.

2. The apparatus of claim 1 wherein the network fault comprise at least one of a transformer failure, a transformer overload, a reactive load change, a transformer winding ratios fault, a transformer loading fault, and a continuity fault.

3. A network system for use with a power distribution network comprising:
a plurality of sounding devices adapted for electrical connection to the power distribution network and adapted to detect for detecting network phenomena faults of the power distribution network, each sounding device comprising:
a signal injection device adapted to be connected to the power distribution network for injecting a VLF band analog sounding signal having signal parameters onto the power distribution network wherein the signal parameters of the sounding signal comprise at least one of a variable voltage, a variable current, and a variable gain and wherein the signal injection device comprises:
a programmable waveform generator comprising a microprocessor connected to a digital-to-analog converter having an output port adapted to provide the analog sounding signal having the signal parameters;
a transmitting coupler electrically connected to a line of the power distribution network; and
an amplifier having an input port connected to the output of the generator for receiving the analog sounding signal and having an output port electrically connected to the line of the power distribution network via the transmitting coupler providing an amplified sounding signal injected on to the power distribution network;
a signal receiving device adapted to be connected to the power distribution network for receiving the injected signals on the power distribution network, said signal receiving device adapted to identify the signal parameters of each of the received signals and adapted to compare the signal parameters of each of the injected signals with respect to the identified signal parameters of its corresponding received signal wherein the signal receiving device comprises:
a receiving coupler electrically connected to the line of the power distribution network for providing received sounding signals;
an analog-to-digital converter having an input port electrically connected to the line of the power distribution network via the receiving coupler and having an output port for providing converted, received digital signals;
a digital processor having an input port connected to the output port of the analog-to-digital converter for receiving the converted, received digital signals, wherein the digital processor compares the injected signal parameters with the received signal parameters to determine impedance or network gain indicative of a network fault corresponding to the compared parameters wherein the network fault comprise at least one of a power distribution network fault and a transformer fault; and
a display connected to the microprocessor adapted to provide an indication of one or more of the determined network faults.

4. The network system of claim 3 wherein the network fault comprise at least one of a transformer failure, a transformer overload, a reactive load change, a transformer winding ratios fault, a transformer loading fault, and a continuity fault.

5. The apparatus of claim 2 wherein the power distribution network has a capacitor bank and wherein the network fault comprises a capacitor bank switching fault.

6. The apparatus of claim 1 wherein the digital processor uses a projection operation including OFDM demodulation and CDMA despreading of the received signal to determine the differences in the injected signal parameters and the received signal parameters.

7. The apparatus of claim 1 wherein when the digital processor determines an increase in the channel gain in the differences in the injected signal parameters and the received signal parameters, the display indicates an increased load on a sub-network of the power distribution network.

8. The apparatus of claim 1 wherein when the digital processor determines a zero gain and/or very high (e.g., infinite) impedance in the differences in the injected signal parameters and the received signal parameters, the display indicates an open circuit.

9. The apparatus of claim 1 wherein the microprocessor and the digital processor comprise a single processor.

10. The apparatus of claim 1 wherein the display presents one or more of the following: the injected signal parameters, the received signal parameters, text or graphical information regarding the evaluation the signal parameters of the injected signal with respect to the determined signal parameters of the received signal, text or graphical information regarding the determined network fault corresponding to the evaluated parameters, and a waveform diagram of the injected signal and/or the received signal.

11. The network system of claim 4 wherein the power distribution network has a capacitor bank and wherein the network fault comprises a capacitor bank switching fault.

12. The network system of claim 3 wherein the digital processor uses a projection operation including OFDM demodulation and CDMA despreading of the received signal to determine the differences in the injected signal parameters and the received signal parameters.

13. The network system of claim 3 wherein when the digital processor determines an increase in the channel gain in the differences in the injected signal parameters and the received signal parameters, the display indicates an increased load on a sub-network of the power distribution network.

14. The network system of claim 3 wherein when the digital processor determines a zero gain and/or very high (e.g., infinite) impedance in the differences in the injected signal parameters and the received signal parameters, the display indicates an open circuit.

15. The network system of claim 3 wherein the microprocessor and the digital processor comprise a single processor.

16. The network system of claim 3 wherein the display presents one or more of the injected signal parameters, the received signal parameters, text or graphical information regarding the evaluation the signal parameters of the injected signal with respect to the determined signal parameters of the received signal, text or graphical information regarding the determined network fault corresponding to the evaluated parameters, and a waveform diagram of the injected signal and/or the received signal.

17. A method for detecting network fault of a power distribution network having a transformer, comprising the steps of:
    injecting a VLF band analog sounding signal having signal parameters onto the power distribution network wherein the signal parameters of the sounding signal comprise at least one of a variable voltage, a variable current, and a variable gain;
    receiving the injected signal on the power distribution network;
    converting the received injected signal into a digital signal;
    identifying the signal parameters of the digital signal;
    comparing the signal parameters of the injected signal with respect to the identified signal parameters of the digital signal to determine impedance or network gain indicative of a network fault corresponding to the compared parameters wherein the network fault comprise at least one of a power distribution network fault and a transformer fault; and
    providing an indication of one or more of the determined network faults.

18. The method of claim 17 wherein the network fault comprise at least one of a transformer failure, a transformer overload, a reactive load change, a transformer winding ratios fault, a transformer loading fault, and a continuity fault.

19. The method of claim 18 wherein the power distribution network has a capacitor bank and wherein the network fault comprises a capacitor bank switching fault.

20. The method of claim 17 including OFDM demodulation and CDMA despreading of the received signal to determine the differences in the injected signal parameters and the received signal parameters.

* * * * *